(12) United States Patent
Kusunoki et al.

(10) Patent No.: US 10,586,674 B2
(45) Date of Patent: Mar. 10, 2020

(54) FIELD EMISSION ELECTRON SOURCE, METHOD FOR MANUFACTURING SAME, AND ELECTRON BEAM DEVICE

(71) Applicant: Hitachi High-Technologies Corporation, Minato-ku, Tokyo (JP)

(72) Inventors: Toshiaki Kusunoki, Tokyo (JP); Tomihiro Hashizume, Tokyo (JP); Keigo Kasuya, Tokyo (JP); Takashi Ohshima, Tokyo (JP); Yusuke Sakai, Tokyo (JP); Yoichi Ose, Tokyo (JP); Noriaki Arai, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/081,372

(22) PCT Filed: Nov. 24, 2016

(86) PCT No.: PCT/JP2016/084726
§ 371 (c)(1),
(2) Date: Aug. 30, 2018

(87) PCT Pub. No.: WO2017/149862
PCT Pub. Date: Sep. 8, 2017

(65) Prior Publication Data
US 2019/0066966 A1    Feb. 28, 2019

(30) Foreign Application Priority Data

Mar. 1, 2016 (JP) .................................. 2016-038898

(51) Int. Cl.
*H01J 37/073* (2006.01)
*H01J 1/22* (2006.01)
(Continued)

(52) U.S. Cl.
CPC .............. *H01J 37/073* (2013.01); *H01J 1/22* (2013.01); *H01J 1/3044* (2013.01); *H01J 9/025* (2013.01);
(Continued)

(58) Field of Classification Search
CPC .. H01J 37/00; H01J 37/02; H01J 37/06; H01J 37/065; H01J 37/073
(Continued)

(56) References Cited

U.S. PATENT DOCUMENTS 6,448,700 B1    9/2002  Gupta et al.
2005/0212395 A1  9/2005  Anazawa et al.
(Continued)

FOREIGN PATENT DOCUMENTS

CN    101051595 A    10/2007
JP    55-104043 A    8/1980
(Continued)

OTHER PUBLICATIONS

International Search Report (PCT/ISA/210) issued in PCT Application No. PCT/JP2016/084726 dated Feb. 28, 2017 with English translation (four (4) pages).
(Continued)

*Primary Examiner* — Jason L McCormack
(74) *Attorney, Agent, or Firm* — Crowell & Moring LLP

(57) ABSTRACT

In order to provide a stable hexaboride single-crystal field emission electron source capable of heat-flashing, this field emission electron source is provided with a metal filament, a metal tube joined thereto, a hexaboride tip that emits electrons, and graphite sheets that are independent of the metal tube and the hexaboride tip. The hexaboride tip is arranged so as not to be in structural contact with the metal tube due to the graphite sheets. The hexaboride tip, the
(Continued)

graphite sheets, and the metal tube are configured so as to be mechanically and electrically in contact with one another.

11 Claims, 21 Drawing Sheets

(51) Int. Cl.
    *H01J 1/304* (2006.01)
    *H01J 9/02* (2006.01)
    *H01J 37/28* (2006.01)

(52) U.S. Cl.
    CPC ..... *H01J 37/28* (2013.01); *H01J 2237/06341* (2013.01); *H01J 2237/28* (2013.01)

(58) Field of Classification Search
    USPC .......................................... 250/306, 307, 311
    See application file for complete search history.

(56) References Cited

U.S. PATENT DOCUMENTS

| | | | |
|---|---|---|---|
| 2007/0236126 A1 | 10/2007 | Wei et al. | |
| 2010/0301736 A1 | 12/2010 | Morishita et al. | |
| 2011/0043103 A1* | 2/2011 | Morishima | C09K 11/06 |
| | | | 313/504 |
| 2011/0186735 A1* | 8/2011 | Fujieda | B01J 19/08 |
| | | | 250/311 |
| 2014/0065918 A1* | 3/2014 | Magera | H01J 37/065 |
| | | | 445/29 |
| 2015/0002009 A1 | 1/2015 | Zhang et al. | |
| 2015/0054398 A1 | 2/2015 | Yan | |

FOREIGN PATENT DOCUMENTS

| | | |
|---|---|---|
| JP | 61-83245 U | 6/1986 |
| JP | 64-7450 A | 1/1989 |
| JP | 2005-276498 A | 10/2005 |
| JP | 2009-26710 A | 2/2009 |
| JP | 2011-14529 A | 1/2011 |
| JP | 2011-181339 A | 9/2011 |
| JP | 2015-518245 A | 6/2015 |
| WO | WO 2014/007121 A1 | 1/2014 |

OTHER PUBLICATIONS

Japanese-language Written Opinion (PCT/ISA/237) issued in PCT Application No. PCT/JP2016/084726 dated Feb. 28, 2017 (three (3) pages).

Chinese-language Office Action issued in counterpart Chinese Application No. 201680082576.4 dated Sep. 3, 2019 with English translation (15 pages).

* cited by examiner

FIG. 14
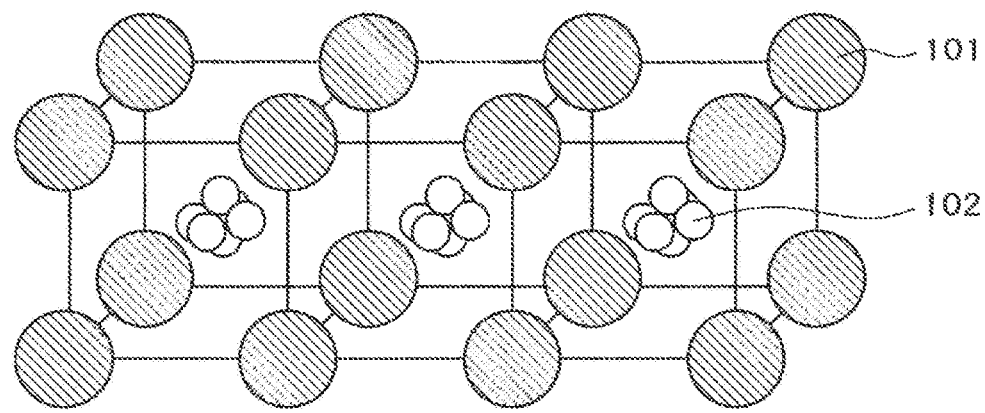
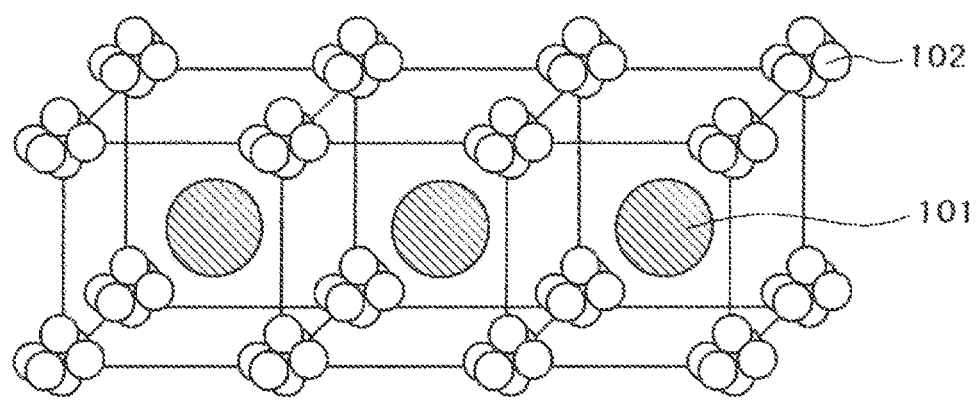

FIELD EMISSION ELECTRON SOURCE, METHOD FOR MANUFACTURING SAME, AND ELECTRON BEAM DEVICE

TECHNICAL FIELD

The present invention relates to a field emission electron source, a method for manufacturing same and an electron beam device.

BACKGROUND ART

A field emission electron source is excellent in monochromaticity and capable of emitting an electron beam at high brightness, and used as an electron source, for example, of a scanning electron microscope or a transmission electron microscope at high resolution power. As the field emission electron source, while tungsten (W) has been used generally, since W has a large work function, electron tunnel probability is small and the amount of emitted current is small. Then, a field emission electron source using a hexaboride nanowire of low work function is proposed (for example, Patent Literature 1). Patent Literature 2 discloses a thermal electron source of heating a hexaboride to emit thermal electrons.

CITATION LIST

Patent Literature

Patent Literature 1: WO 2014/007121
Patent Literature 2: Japanese Unexamined Patent Application Publication No. Hei 01-7450

SUMMARY OF INVENTION

Technical Problem

Hexaborides are highly reactive and liable to adsorb gases thereby suffering from contamination. When a residual gas is adsorbed on the surface of the field emission electron source used at a room temperature, since the residual gas transfers on the absorption site on the electron emission surface to fluctuate the work function, this may lead to concerns, for example, of generating noises in the emission current, and furthermore, lowering with time of the emission current along with increase in the adsorption amount of the residual gas. Accordingly, a countermeasure, for example, heat flashing (or annealing, hereinafter referred to as heat flashing) of hexaborides, for cleaning same is necessary in the same manner as that for a field emission electron source using W.

The W field emission electron source is spot-welded to a hairpin type W filament, and a flashing treatment of heating the W filament to a high temperature of 2000° C. or higher undercurrent supply for a short time of about several seconds or an annealing treatment of heating at a somewhat lower temperature for about several minutes is applied to release the gas and clean the surface of the electron source. However, when the hexaboride field emission type electron source is flashed in this structure, a compound is formed at a spot-weld portion between the hexaboride and the W filament to cause corrosion. Further, since this is a joined portion of different materials having different thermal expansion coefficients, this may pose a problem such as breakage in the junction due to thermal stress fatigue caused by heat flashing.

Patent Literature 2 discloses a thermal electron source including a metal filament, a metal member joined to the filament, a carbon member and a hexaboride. In Patent Literature 2, the filament and the metal member are bonded but, unlike a thermal electron source used at a normal temperature, when this is applied to the field emission electron source, there is a problem incapable of coping with repetitive thermal stresses due to temperature cycles between a high temperature upon heat flashing and a room temperature as the operation temperature.

The present invention intends to provide a field emission electron source capable of reducing noises and aging change even in a case of using a hexaboride and capable of obtaining an electron beam at high brightness, providing stable operation and excellent in monochromaticity, a manufacturing method thereof, and an electron beam device.

Solution to Problem

An embodiment for attaining the purpose described above provides a field emission electron source including a heater including a metal filament, a metal member joined with the heater, a hexaboride tip emitting electrons from the apex upon generation of an electric field and a graphite sheet independent of the metal member and the hexaboride tip, wherein the hexaboride tip is arranged so as to protrude from the inside of the metal member in the direction opposite to the extending direction of the heater and arranged so as not to be in structural contact with the metal member by means of the graphite sheet, and further, the hexaboride tip, the graphite sheet and the metal member are in a structure mechanically and electrically in contact with each other.

Advantageous Effects of Invention

The present invention can provide a field emission electron source capable of reducing noises and aging change even in a case of using a hexaboride and capable of obtaining an electron beam at high brightness, providing stable operation and excellent in monochromaticity, a manufacturing method thereof, and an electron beam device.

BRIEF DESCRIPTION OF DRAWINGS

FIG. 14 is a perspective view illustrating an example of a crystal plane of a hexaboride single crystal (the upper view shows a case where a (001) plane of a binary hexaboride single crystal is terminated by metal atoms, and the lower view shows a case where a (001) plane of a binary hexaboride single crystal is terminated by boron atoms).

DESCRIPTION OF EMBODIMENTS

As a result of a study made by the present inventors, it has been found that a metal member and a hexaboride to be joined to a filament including a metal may be arranged and press bonded so as not to be in structural contact with each other by way of graphite independent of the metal member and the hexaboride and bring the metal member and the hexaboride into a mechanically and electrically contact-joined structure. Since the hexaboride is used, and the work function at the electron emission surface is low, an emission current is large. Further, since the hexaboride is not in direct contact with the metal (heater), no compound is formed and repetitive heat flashing by heating is easy. Accordingly, even if contamination is caused by gas adsorption, etc., regeneration is easy and a field emission electron source of a hexaboride single crystal can be obtained inexpensively.

The present invention is to be described byway of examples with reference to the drawings. In the following drawings, for easy understanding of the configurations of the invention, a scale down ratio for each of the configurations is optionally changed.

Example 1

A field emission electron source according to Example 1 and a manufacturing method are to be explained with reference to FIG. 1 to FIG. 13.

Figure 1:
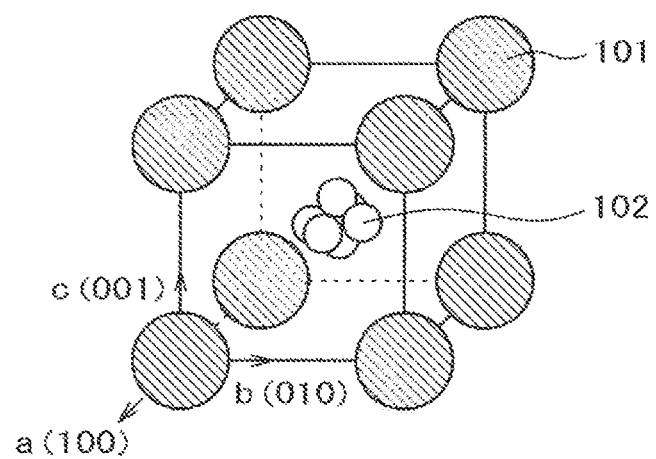
FIG. 1 is a perspective view illustrating a crystal structure of a hexaboride single crystal (unit lattice) used in a field emission electron source according to each of examples.

In Example 1, as materials for the electron source, hexaborides of rare earth elements, alkaline earth metals, etc. are used. Specifically, La, Ce, Pr, Nd, Sm, Eu, and Gd as lanthanide series elements and Ca, Sr, and Ba, etc. as alkaline earth metals can be used which are represented respectively by chemical formulas: $LaB_6$, $CeB_6$, $PrB_6$, $NdB_6$, $SmB_6$, $EuB_6$, $GdB_6$, $CaB_6$, $SrB_6$, $BaB_6$, etc. FIG. 1 shows a unit lattice thereof. In the structure, a block of six boron atoms 102 situates at the body center of a simple cubic lattice of a metal atoms 101. Most of the such materials, in particular, materials using rare earth elements generally have high melting points, low vapor pressure, high hardness, high impact resistance, and lower work function than that of W. Accordingly, $LaB_6$ and $CeB_6$, etc. are materials widely utilized generally as a thermal electron source by heating to about 1500° C.

Such a hexaboride single crystal can be prepared as a large single crystal having a diameter of several mm and a length of several tens mm grown in the (001) direction of the crystal habit plane at which the crystals grows preferentially by melt (liquid phase) growth using, for example, by a floating zone method or Al flux method. In a case of use for a thermal electron source, the single crystal is cutout by grinding to a tip of a several hundred μm square and a several mm length, and a (001) surface is utilized as an electron emitting surface. The crystal structure of the hexaboride is a simple cubic lattice as illustrated in FIG. 1 in which the (001) plane is equivalent with a (100) plane, a (010) plane, etc. In Example 1, the following explanation is given while defining the c axis as a crystal habit axis and the (001) plane which is the c-plane as a crystal habit plane in view of convenience.

The hexaboride single crystal has been utilized as the thermal electron source in this way but remained so far at a level of study and not served to practical use as the field emission source. This is due to the reasons, for example, that because the hexaborides are generally highly hard and ceramic-like brittle materials, sharpening at the end of the tip is more difficult compared with that of W and the brightness (current density per unit cubic angle: $A/m^2/sr$) was not sufficient, because this is a binary material composed of metal element and boron, it was difficult to obtain an electron emission surface of stable elemental composition at a room temperature that is an operation temperature of the field emission electron source with good reproducibility, and that the current decreases greatly when used at a room temperature due to the effect of gas adsorption, etc. In the case of the thermal electron source used at a high temperature of about 1500° C., a fresh metal termination (001) surface is always grown by rearrangement and evaporation of atoms, and gas adsorption can also be prevented.

However, with respect to the sharpening at the end of the tip, fabrication to a needle shape with small radius of curvature has become possible even for such ceramic-like materials owing to the progress in the technique, for example, of focused ion beam fabrication, etc. in recent years. For example, in the atom probe analysis in combination of a field ion microscope and a time-of-flight analysis type ion detector, a technique of fabricating various composite materials into a needle shape with a radius of curvature of 0.1 μm or less capable of field evaporation in a field ion microscope can be realized by using a focused ion beam method.

Figure 2:
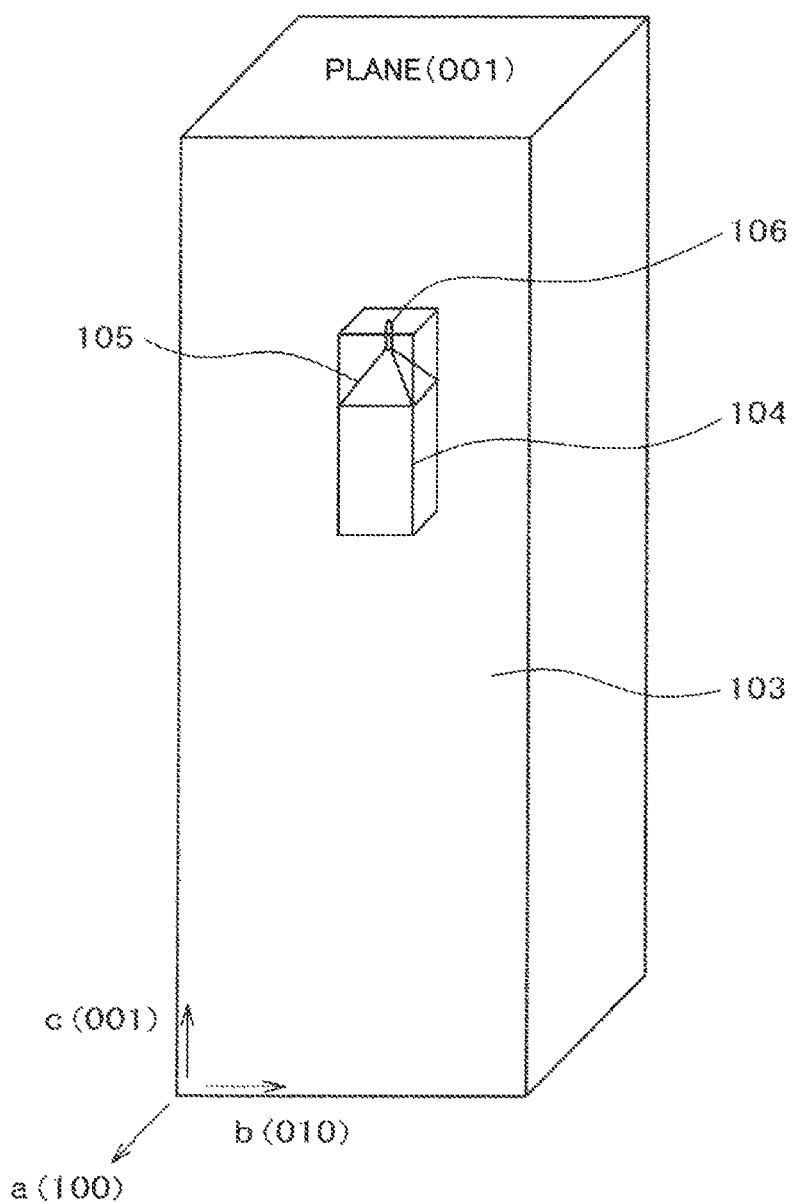
FIG. 2 is a schematic perspective view for explaining a method of manufacturing a hexaboride single crystal tip in a method of manufacturing a field emission electron source according to Example 1.
Figure 3:
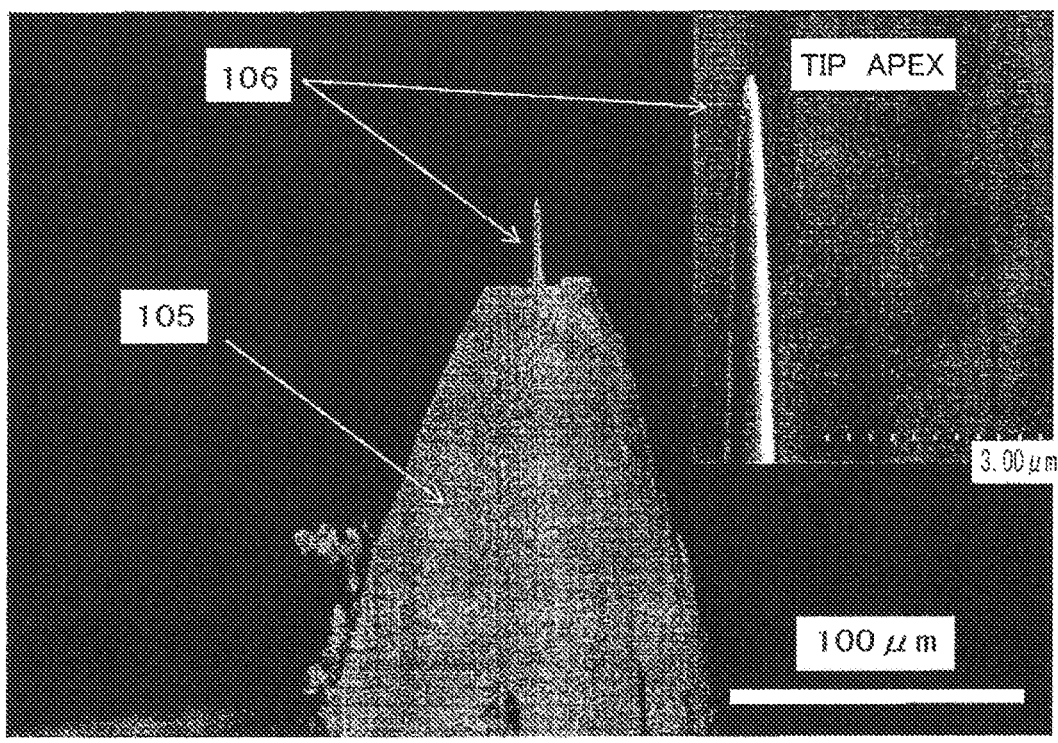
FIG. 3 is a scanning electron microscopic image illustrating an example of a sharpened portion of a hexaboride single crystal tip sharpened by using a focused ion beam at the end of the hexaboride single crystal tip shown in FIG. 2.

In Example 1, a tip including a hexaboride single crystal of a field electron emission source was prepared first taking notice on such fabrication technique. FIG. 2 illustrates a schematic view for a preparation method of hexaboride single crystal for a field electron emission source in Example 1, and FIG. 3 illustrates a scanning microscopic photograph at the apex of an actually prepared hexaboride single crystal of a field electron emission source. First, single crystals of $LaB_6$, $CeB_6$, etc. having a diameter of several mm and a length of several cm are grown by a melt crystal growing using, for example, a floating zone method. The hexaboride single crystal is a simple cubic lattice having a (001) plane as a crystal habit plane and a parallelepiped hexaboride single crystal 103 having a major axis in the direction of (001) axis is generally obtained.

Successively, a crystal axis is measured by using, for example, an X-ray Laue method and the tip is cutout along a predetermined crystal axis. In a thermal electron source, crystal is generally cutout in the (001) direction. Also in Example 1, a tip 104 of about a 100 to 500 μm square and 1 to 5 mm length was first cutout in the (001) direction. By the cutting, plural substrates of tips 104 were cutout from one single crystal (only one of them is shown as a typical example in the drawing).

Successively, the end of the cutout tip 104 is dipped, for example, in an aqueous nitric acid solution and electropolishing is performed by applying an AC electric field. This was performed as a pretreatment of refining the size of the apex of the hexaboride single crystal tip for saving the processing time in the subsequent fabrication by using a focused ion beam (electropolished portion 105 in FIG. 2, FIG. 3.

Successively, the apex of the tip 104 is ground into a needle shape with a radius of curvature of 0.1 μm or less by a focused ion beam using Ga ions. While the length of the sharpened portion 106 at the apex is optional, it is desirably 10 μm or more, for easy concentration of the electric field and allowing shortening of the length of the sharpened portion 106 in the surface cleaning step by field evaporation treatment or heat flashing treatment to be described later.

Successively, the fabricated hexaboride single crystal tip 104 is joined to a heater. In a case of joining to a glassy-carbon heater by using an adhesive, a joined portion which is mechanically strong and excellent in electric contact and thermal contact can be formed between the electron source tip and the carbon heater by using an adhesive of an organic resin including fillers, for example, of carbon, boron, carbon boride, etc. dissolved therein in the joining of the carbon heater and removing organic components by heat baking in vacuum. However, since such an organic resin type adhesive is embrittled when carbonized completely, making joining impossible, organic components, etc. may remain more or less. The field emission electron source is generally sensitive to the surface contamination and it has been gradually found that the residual gas components of the adhesives give undesired effects on the current stability also in the hexaboride field emission electron source. Further, the working temperature of the field emission electron source is at a room temperature, and heating to 1400° C. or higher is applied only upon heat flashing or annealing. Accordingly, it has been found that when they are bonded firmly by the adhesive, since repetitive thermal stresses due to the difference of thermal expansion coefficients are generated between the hexaboride (thermal expansion coefficient: $6.2 \times 10^{-6}$/K) and a glassycarbon (thermal expansion coefficient: $2.6 \times 10^{-6}$/K), in the joined portion, cracking or peeling may possibly be generated in the joined portion.

Figure 4A:
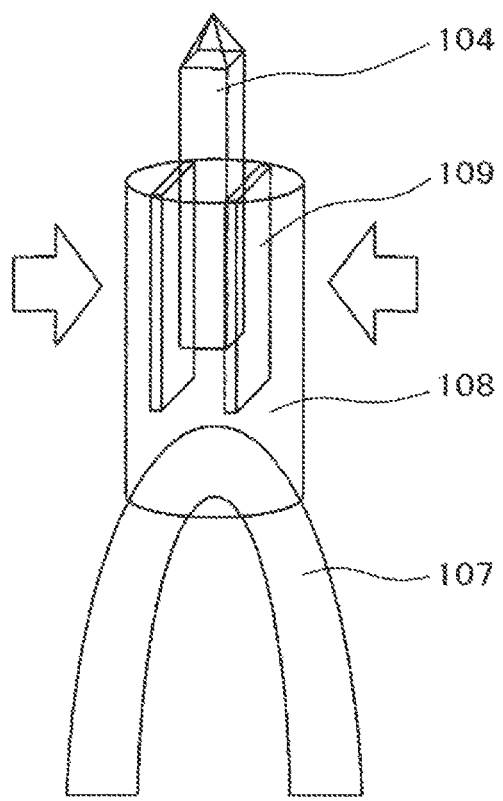
FIG. 4A is a schematic perspective view for explaining a method of manufacturing a field emission electron source according to each of examples (state of a heat retaining structure before press bonding a metal member by way of a graphite sheet to a hexaboride single crystal tip).
Figure 4B:
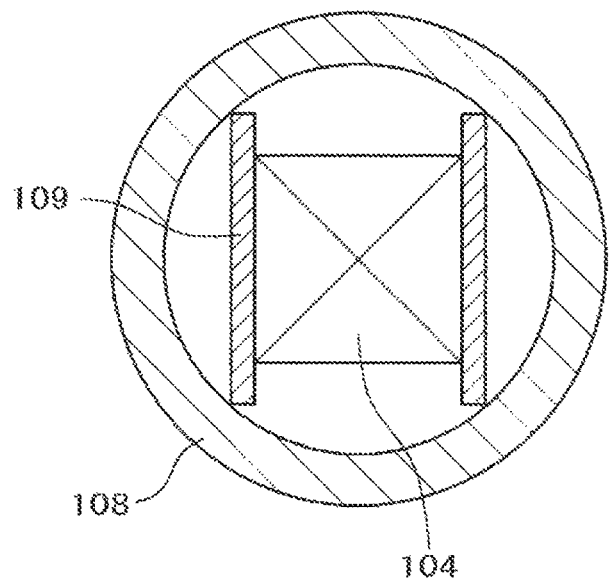
FIG. 4B is a schematic upper plan view for explaining a method of manufacturing a field emission electron source according to each of examples (state of a heat retaining structure before press bonding a metal member by way of a graphite sheet to a hexaboride single crystal tip).
Figure 4C:
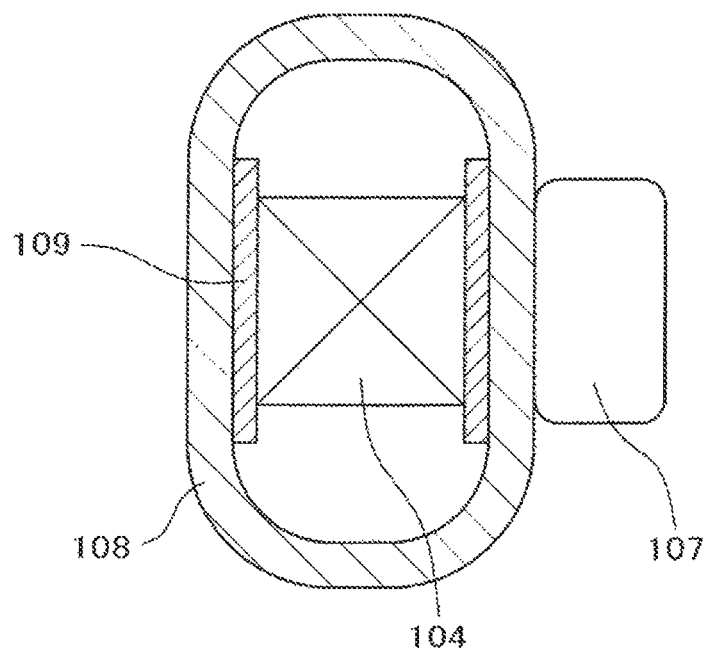
FIG. 4C is a schematic upper plan view for explaining a method of manufacturing a field emission electron source according to each of examples (state of a heat retaining structure afterpress bonding a metal member by way of a graphite sheet to a hexaboride single crystal tip).

Then, in Example 1, a field emission electron source having a new heating and retaining structure capable of retaining a hexaboride single crystal tip 104 and enabling heat flashing has been developed as illustrated in FIG. 4A. Specifically, as shown in FIG. 4B, which is an upper plan view of FIG. 4A, a tip 104 is sandwiched by way of graphite sheets 109 not containing an organic component in a tubular metal member 108 to be joined to a metal filament 107, and the hexaboride single crystal tip 104, the graphite sheet 109 and the metal member 108 are press bonded in the direction of arrows as shown in FIG. 4A, to attain a structure in which the hexaboride single crystal tip 104, the graphite sheet 109, and the metal member 108 are in mechanical and electric contact with each other as shown in FIG. 4C which is an upper plan view of FIG. 4A.

For the metal filament 107, while high melting metals W, Mo, Ta, Nb, etc. are usable, a hairpin filament including tungsten (W) having sufficient results, the highest melting point and also high rigidity in existent W field emission electron sources is used optimally. For the metal member 108 joined to the filament, while high melting metals such as W, Mo, Ta, and Nb are also usable, a high melting metal tubes of tantalum (Ta) or niobium (Nb) which are soft and easy to be press bonded is most suitable. The graphite sheet 109 is, particularly preferably, a pyrolytic graphite sheet obtained by complete thermal decomposition of organic components. All of such materials have sufficient results and are inexpensive, and can prepare a heating and retaining structure at a reduced cost with high reliability.

Figure 5A:
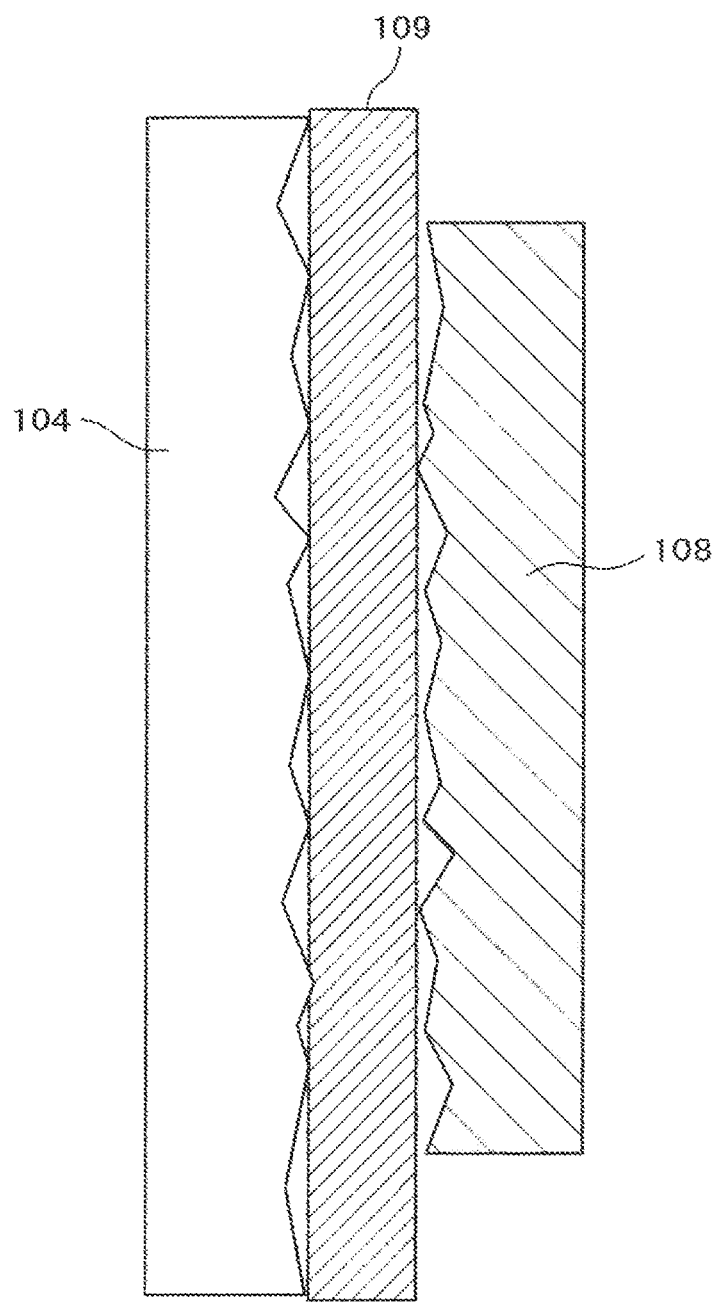
FIG. 5A is a schematic cross sectional view of an enlarged detailed structure for explaining a state of a press bonded part of the heat retaining structure at a room temperature illustrated in FIG. 4C.
Figure 5B:
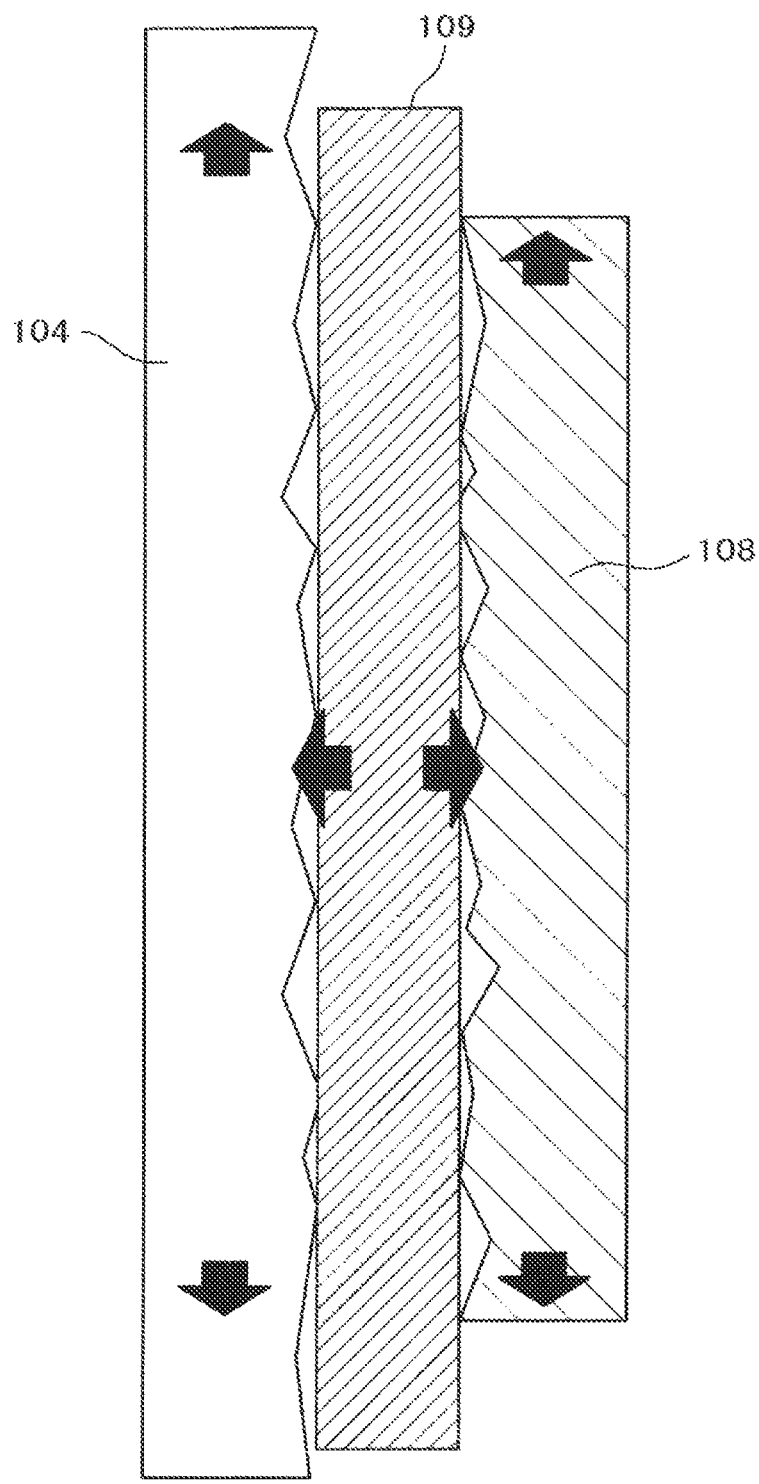
FIG. 5B is a schematic cross sectional view of an enlarged detailed structure for explaining a state upon heat flashing of the press bonded part of the heat retaining structure illustrated in FIG. 4C.

FIG. 5A and FIG. 5B illustrate enlarged schematic cross sectional views of a joined portion of a hexaboride single crystal tip 104, a graphite sheet 109, and a metal member 108. In a micro-view point, surfaces of a hexaboride single crystal chip 104 prepared by cutting to 100 to 500 µm square and a metal tube (metal member) 108 such as made of Tantalum or Niobium of 200 to 600 µmϕ have a roughness of about several µm to several tens µm, and they are press bonded at a number of points-to-point contacts to the graphite sheet 109 having a thickness of about 25 µm inserted therebetween as shown in FIG. 5A. Referring to the thermal expansion coefficient, it is approximately identical, for example, as $6.2 \times 1^{-6}$/K for hexaboride lanthanide $LaB_6$ and as $6.3 \times 10^{-6}$/K for tantalum, whereas it is small as $9.2 \times 10^{-7}$/K in the direction of the surface and, on the other hand, is large as $32 \times 10^{-6}$/K in the direction perpendicular to the plane, the pyrolytic graphite sheet. Accordingly, as shown in FIG. 5B, when the joined portion press bonded upon heat flashing is heated to a high temperature, the hexaboride single crystal tip 104 and the metal member 108 extend in the direction of the plane relative to the pyrolytic graphite sheet 109 (arrows in the vertical direction in FIG. 5B). However, since the point-to-point contact portion only slide over the pyrolytic graphite sheet, the joined portion is not mechanically destroyed by thermal stresses. Further, since the pyrolytic graphite sheet expands greatly in the direction of the thickness (arrows in the horizontal directions in FIG. 5B), the press bonding force between the hexaboride single crystal tip 104 and the metal tube 108 is further strengthened by the heating and mechanical and electric contact can be maintained satisfactorily.

Figure 6:
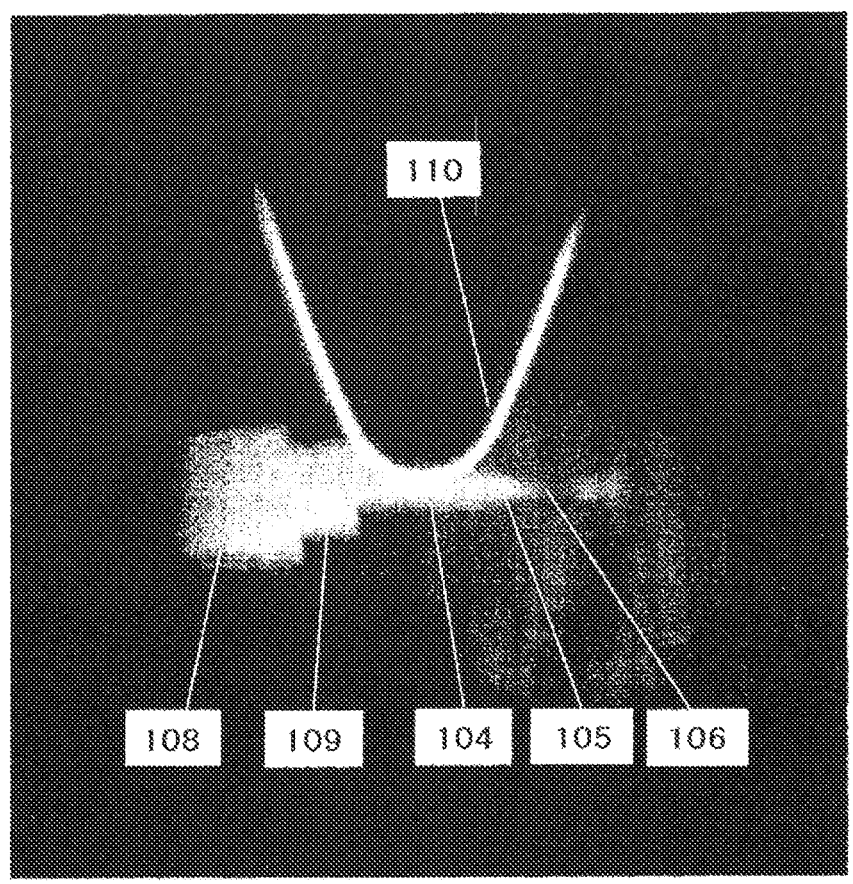
FIG. 6 is a stereoscopic microscope image illustrating the state upon heat flashing of a field emission electron source according to Example 1.
Figure 7:
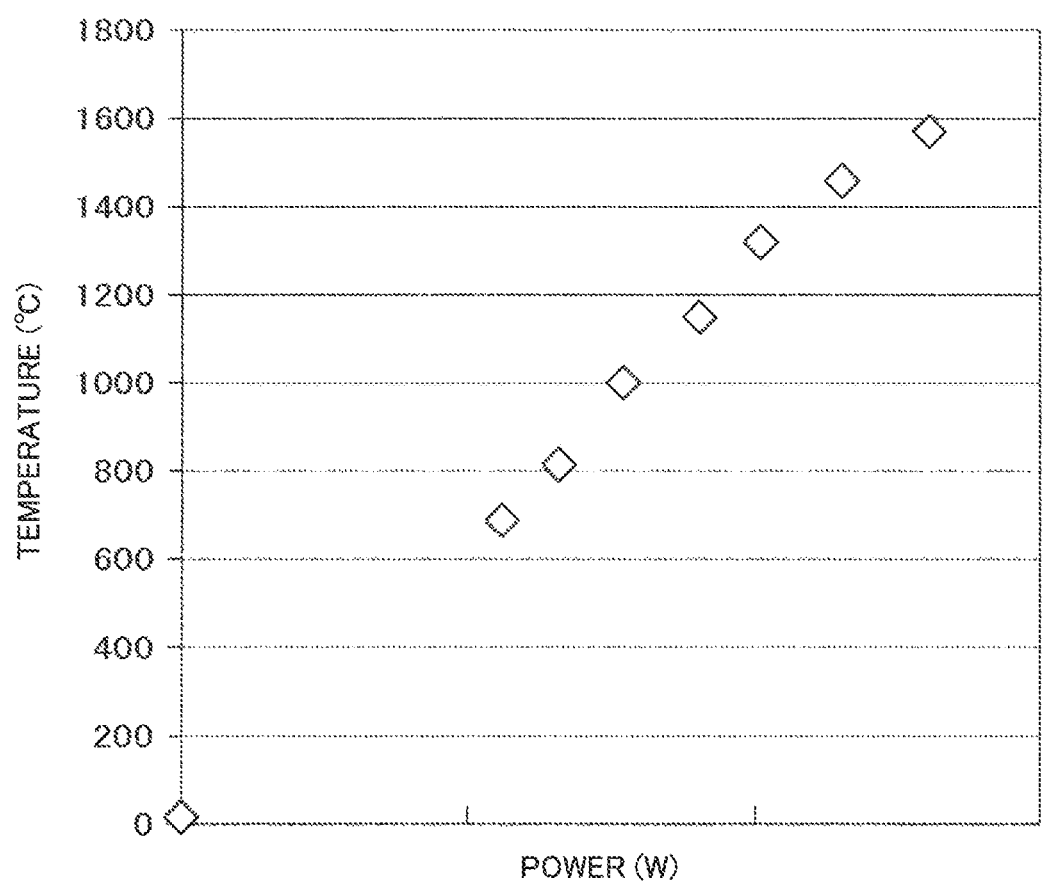
FIG. 7 is a graph illustrating a temperature of the hexaboride single crystal tip the field emission electron source upon heat flashing according to Example 1.

FIG. 6 is a stereoscopic microscope image showing the state of heat flashing the field emission electron source according to Example 1. Reference numeral 110 denotes a colorimetric thermometer. FIG. 7 illustrates a relation between a heating temperature of the hexaboride single crystal tip 104 measured by the colorimetric thermometer 110 and a power applied to the filament 107.

It can be seen that the hexaboride single crystal tip 104 of the field emission electron source can be heated in a well-controlled manner in proportion to the applied power from a room temperature to 1600° C. by controlling the applied power to the filament 107.

Figure 8:
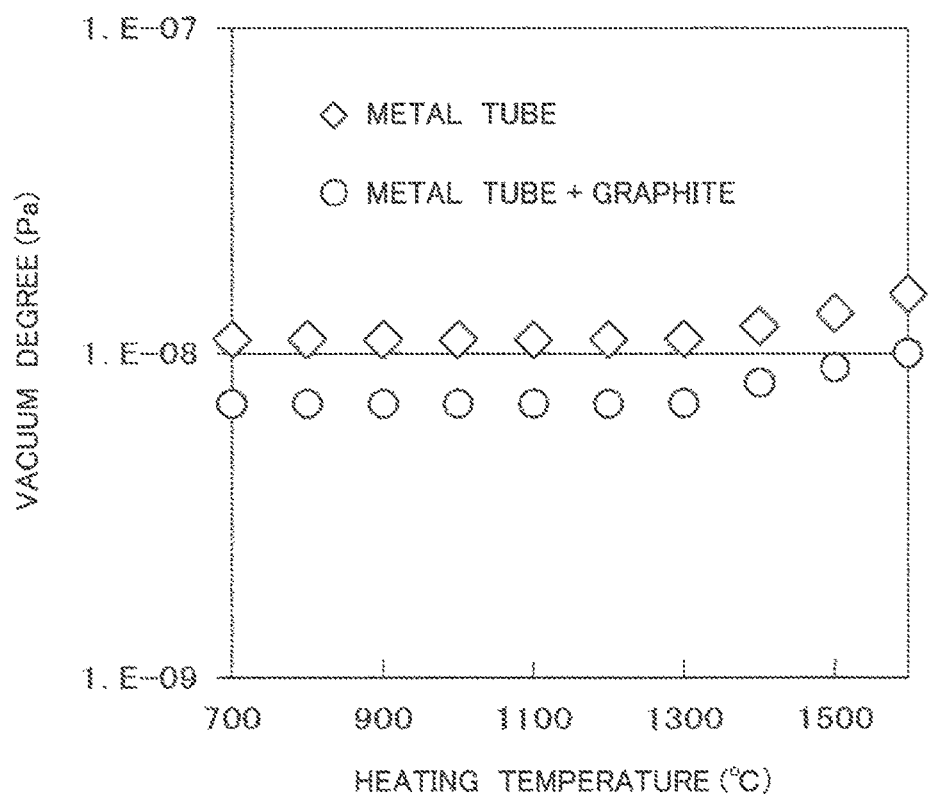
FIG. 8 is a graph illustrating a relation between a heating temperature and a vacuum degree upon heat flashing of the field emission electron source according to Example 1.
Figure 9:
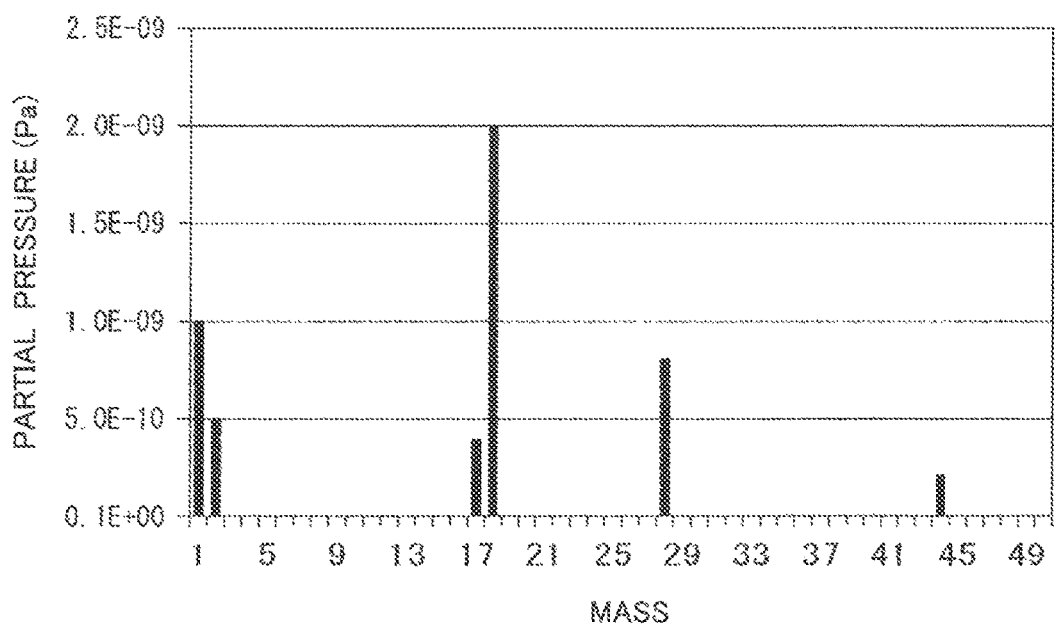
FIG. 9 is a graph illustrating a result of gas mass analysis upon heat flashing of the field emission electron source according to Example 1.

FIG. 8 is a graph illustrating a relation between a heating temperature and a vacuum degree when the field emission electron source according to Example 1 is heat flashed. For the reference, data of retaining the hexaboride single crystal tip 104 only by the Ta metal tube 8 are also shown. In a case of the field emission electron source according to Example 1, that is, when the hexaboride single crystal tip 104 is press bonded by the metal tube 108 by way of a pyrolytic graphite sheet 109, the amount of change of the vacuum degree is considered to be equal within a range of experimental error with the case of joining the hexaboride single crystal tip 104 only by the metal tube 108 and it can be seen that the gas is scarcely released from the pyrolytic graphite sheet. FIG. 9 shows a result of measuring the released gas components by a quadral pole mass analyzer in a case of using the Ta metal tube 108 and the pyrolytic graphite sheet 109. It is found that, most of residual gas components includes hydrogen detected at a mass number of 1 to 2, water detected at a mass number of 17 to 18, carbon monoxide detected at a mass number of 28 and carbon dioxide detected at a mass number of 44, and organic gas components are not detected within a detection sensitivity.

The field emission electron source according to Example 1 can easily undergo heat flashing at 1400° C. or higher, and deterioration of the vacuum degree due to the degassing amount can be decreased while preventing reaction between the metal tube 108 and the hexaboride single crystal tip 104 by using the graphite sheet 109 not containing organic materials. Further, since the hexaboride single crystal tip 104 and the graphite sheet 109, and the graphite sheet 109 and the metal member 108 have a configuration which they are in mechanical contact to each other at a plurality of points, and only the point-to-point contact portions slide over the graphite sheet relative to the thermal expansion due to temperature change, breakage in the joined portion due to thermal stress caused by repetitive heating between the room temperature and the flashing temperature can be prevented.

Figure 10:
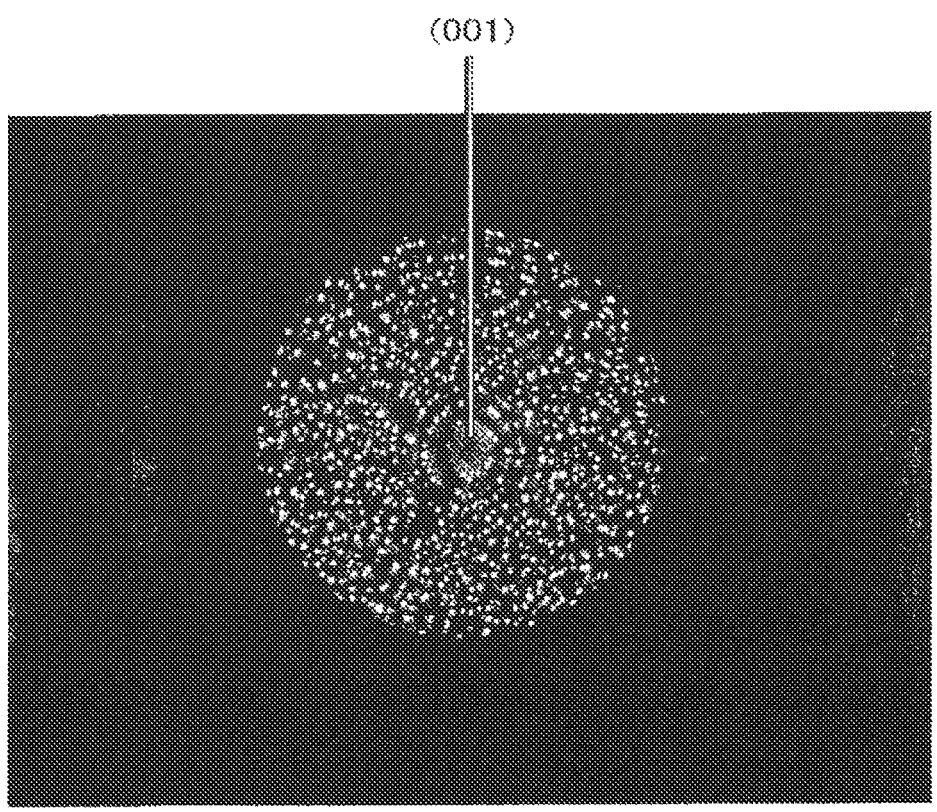
FIG. 10 is an FIM (Field Ion Microscopic) image illustrating that the sharpened apex of the hexaboride single crystal tip of the field emission electron source according to Example 1 is at a (001) surface.

FIG. 10 is an example of an FIM image taken from the hexaboride single crystal field emission electron source cleaned by heat flashing. $LaB_6$ was used as the hexaboride. A pattern of the (001) surface is confirmed at the center and it can be seen that a crystal terrace (facet) of the (001) surface is formed at the apex of the hexaboride single crystal field emission electron source.

Figure 11:
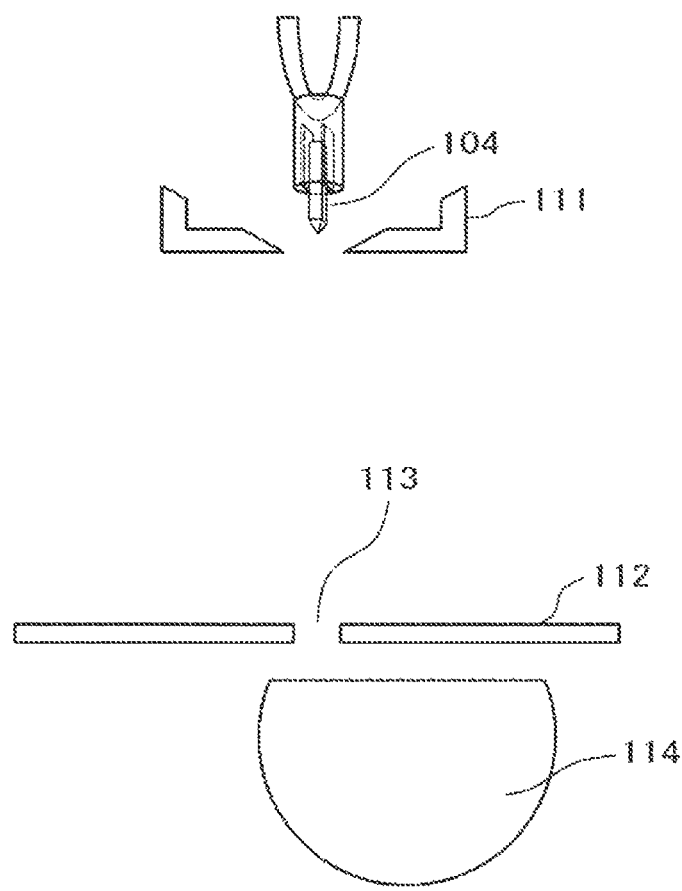
FIG. 11 is a schematic cross sectional view of an evaluation device used for evaluating the field emission electron source according to each of examples.
Figure 12:
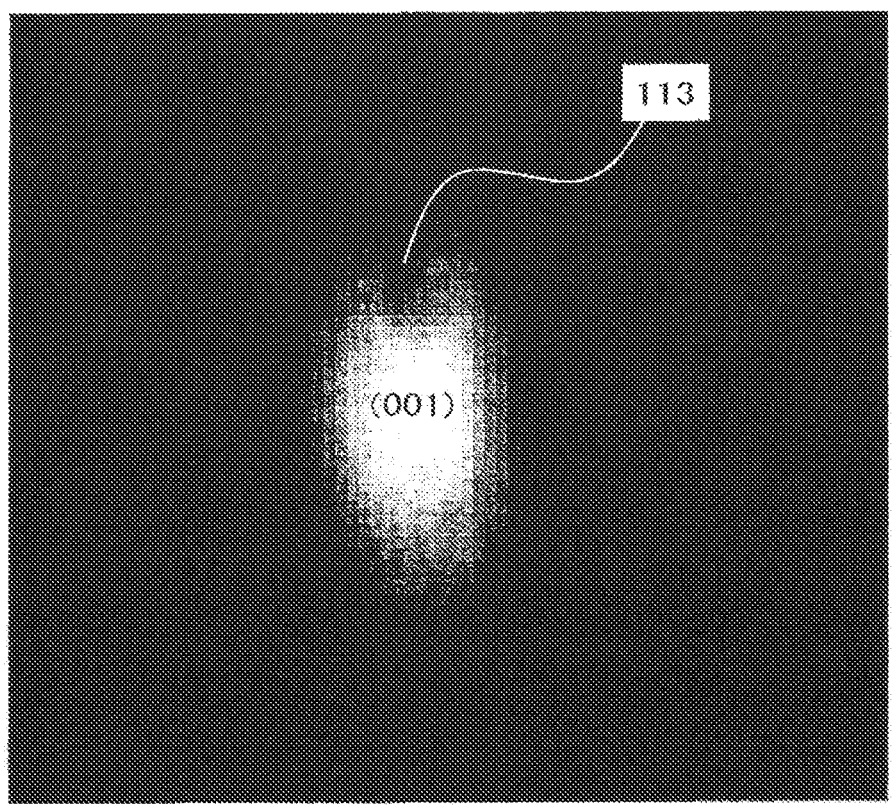
FIG. 12 is an FEM (Field Emission Microscopic) image illustrating that the sharpened apex of the hexaboride single crystal tip in the field emission electron source according to Example 1 is at a (001) surface.
Figure 13:
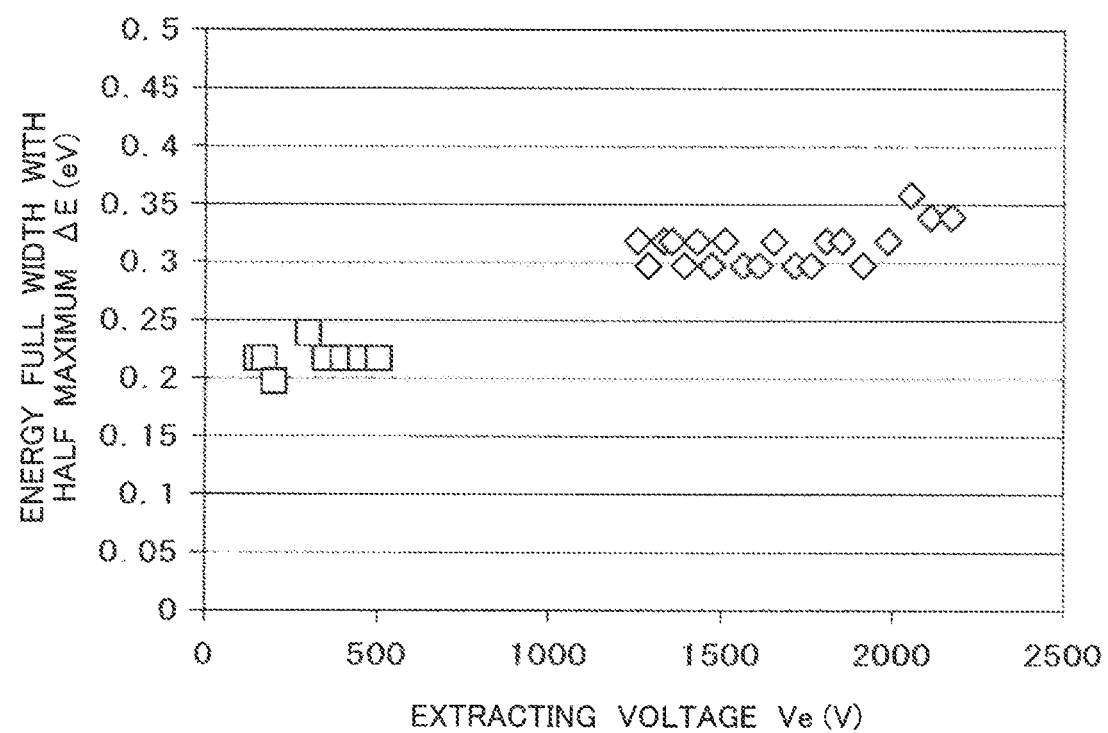
FIG. 13 is a graph comparing an energy full width with half maximum of emitted electrons in the field emission electron source according to Example 1 using a hexaboride with an energy full width with half maximum of emitted electrons in an existent field emission electron source using W.

The thus prepared hexaboride single crystal tip 104 was attached to a measuring device shown in FIG. 11 and evaluated. Since the tip was once exposed to atmospheric air, when attached to an evaluation device, after attaching it to the evaluation device, and vacuum evacuation, heat flashing was applied at 1400° C. before evaluation to clean the surface at the sharpened portion 106 of the field emission electron source. Electrons emitted from the hexaboride single crystal tip 104 of the field emission electron source are drawn out by the anode 111 and incident by way of a probe hole 113 of a fluorescent plate 112 into an energy analyzer 114. At the fluorescent surface, a field emission microscope (FEM) image was observed and the electron emitting (001) crystal surface (facet) was aligned with the pinhole position. The position for the pinhole was aligned with the center of the (002) electron emitting crystal surface terrace (facet). FIG. 12 illustrates an example of the FEM image. For easy observation of the FEM image, the position for the electron beam is somewhat displaced from the probe hole 113. In the same manner as the FIM image, a pattern at the (001) surface is confirmed and it can be seen that a crystal terrace (facet) at the (001) surface is formed at the apex (sharpened portion 106) of the sharpened hexaboride tip 104). FIG. 13 illustrates a measuring result of the energy analysis of emitted electrons. In the hexaboride single crystal field emission electron source using $LaB_6$ of Example 1, an electron beam of excellent monochromaticity having a narrow energy full width with half maximum (0.2 to 0.25 eV) of about ⅔ in average could be obtained at a lower voltage of about ⅓ when compared with the W field emission electron source.

As described above, according to Example 1, it is possible to provide a field emission electron source capable of reducing noises or aging change even in a case of using a hexaboride and capable of obtaining an electron beam at high brightness enabling stable operation and excellent in monochromaticity, as well as a manufacturing method thereof.

Example 2

Example 2 is to be explained with reference to FIG. 14 to FIG. 20. Matters described in Example 1 and not described of the Example 2 are applicable also to Example 2 unless there are particular cases.

In Example 1, the hexaboride single crystal tip 104 was cutout in the direction of the (001) axis of the crystal habit axis of the hexaboride and the (001) plane of the crystal habit plane sharpened by the focused ion beam was utilized as the electron emission surface. As illustrated in FIG. 14, the binary hexaboride single crystal (001) plane includes two cases, that is, a case where a metal termination (001) surface is formed (upper view) and a case where the boron termination (001) surface is formed (lower beam). For the work function on the crystal surface, in a case of the metal termination (001) surface where the metal of small electric negativity is on the side of the surface and boron of large electric negativity is on the side of the bulk, since the polarity of the electric dipole at the surface is positive on the vacuum side, vacuum barrier is lowered to lower the work function, whereas in a case of the boron termination (001) surface where the metal of small electric negativity is on the side of the bulk and boron of large electric negativity is on the side of the surface, since the polarity of the electric dipole on the surface is negative on the vacuum side, the work function is increased. Accordingly, in a case of utilizing the (001) surface as the electron emission surface, the metal termination (001) surface has to be utilized selectively. However, when a cleaned surface is prepared by field evaporation, since the metal termination (001) surface and the boron termination (001) surface appear alternately, cleaning while always selecting the metal termination (001) surface by 100% is not so easy.

Further, in a case of cleaning by heat flashing, surface atomic transfer of metal is easier than that of boron tending to form a metal termination (001) surface. However, since the equilibrium state is not kept by continuous heating unlike the thermal electron source, the metal termination (001) surface is not always selected. Further, the elemental composition for the termination plane at the electron emission surface may possibly change by field evaporation with an intense electric field, Joule heating to the electron source, or local heating to the apex (sharpened portion 106) of the hexaboride single crystal tip 104 of the field emission electron source by the Nottingham effect depending on the operation conditions of taking out a large current, etc. also during operation of the field emission electron source at a normal temperature, in which the emission current may possibly change stepwise.

Then, the present inventors have made an earnest study on the subjects. As a result, it has been found that the foregoing subjects can be overcome by utilizing the crystal plane terrace (facet) perpendicular to the crystal axis, that is, the crystal plane where the metal elements of hexaborides and the boron elements are mixed together at a constant ratio to the field emission electron source, and cutting out the hexaboride single crystal tip 104 in the cutting direction perpendicular to the plane.

Figure 15A:
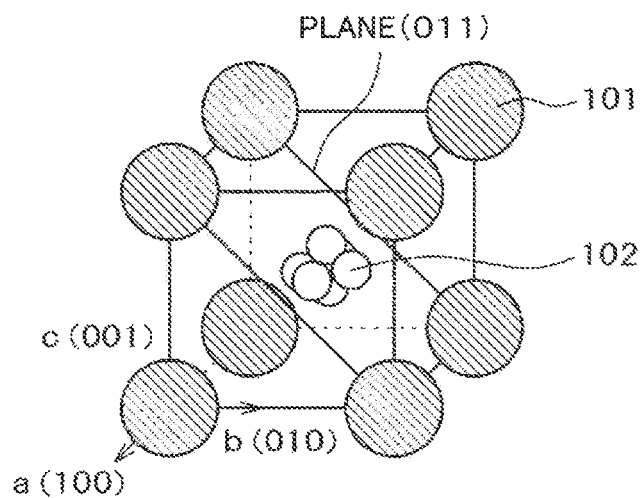
FIG. 15A is a perspective view illustrating an example of a crystal plane of a hexaboride single crystal used in a field emission electron source according to Example 2.
Figure 15B:
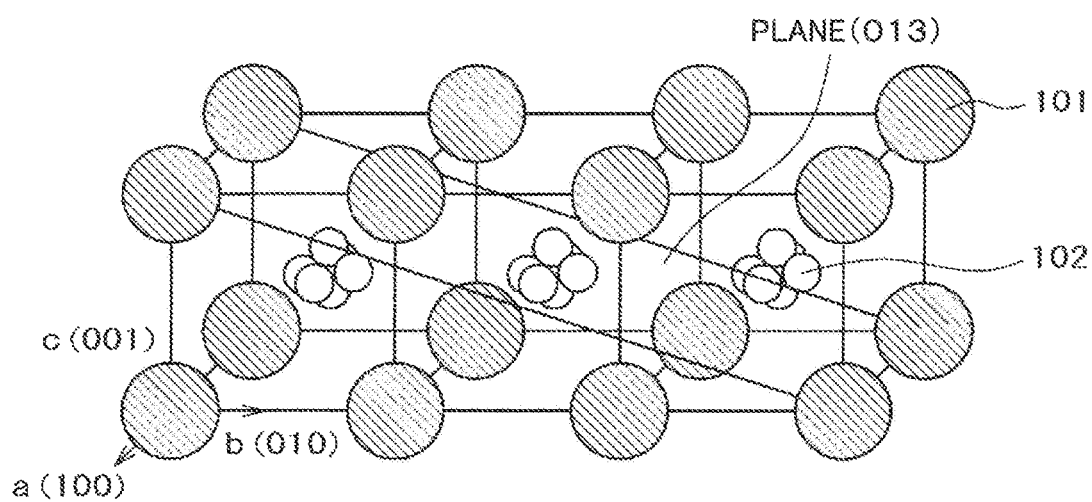
FIG. 15B is a perspective view illustrating another example of a crystal plane of a hexaboride single crystal used in the field emission electron source according to Example 2.
Figure 16:
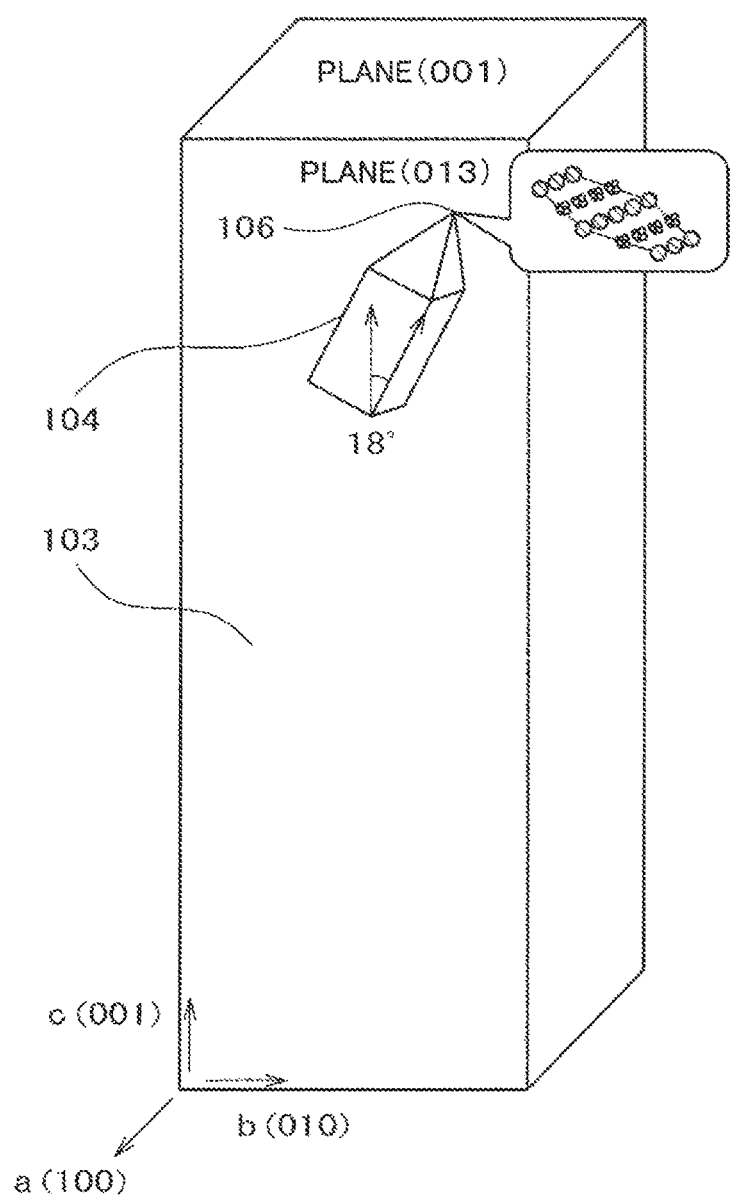
FIG. 16 is a schematic perspective view for explaining a method of manufacturing a hexaboride single crystal tip in the method of manufacturing the field emission electron source according to Example 2.

For example, as shown in FIG. 15A and FIG. 15B, the ratio between the metal element and the boron element at the termination surface can always be kept constant even when field evaporation or heating evaporation should occurs during production of the hexaboride single crystal tip of the field emission electron source or during operation of the field emission electron source, by defining the (01n), for example, (011) plane or (013) plane in which n is odd number. Particularly, (013) plane is a low density plane with a broad atomic distance and since the work function is low, this is further preferred as a field emission electron source.

Figure 17:
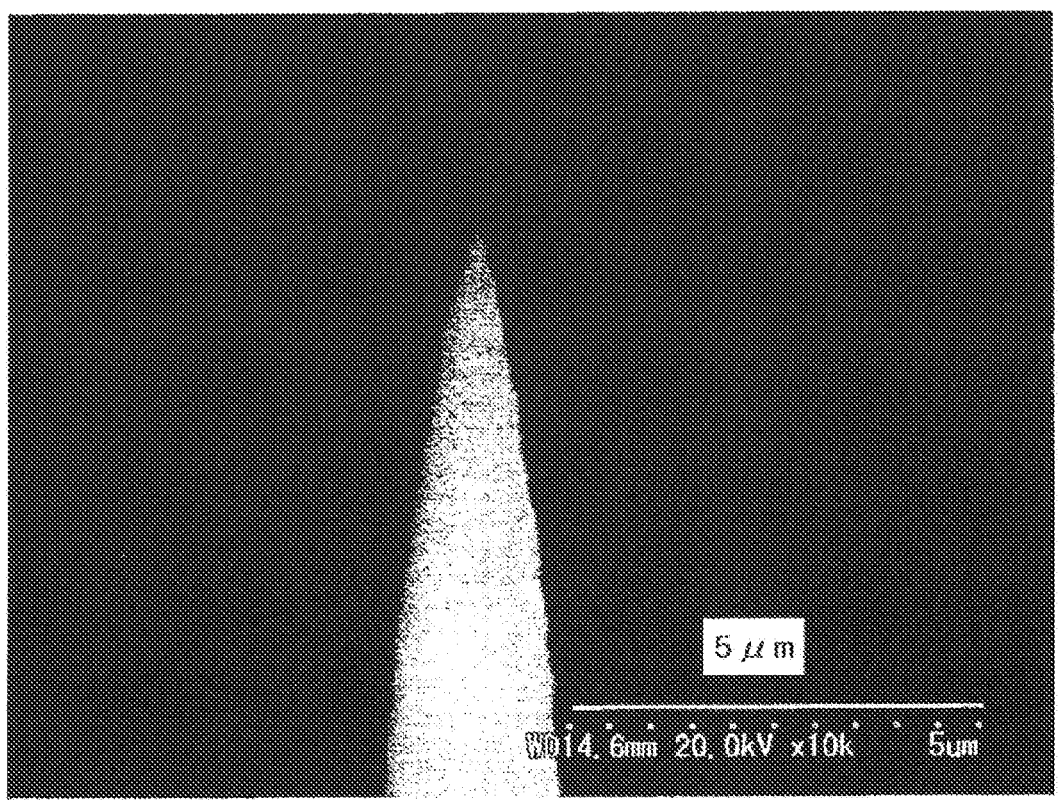
FIG. 17 is a scanning electron microscopic image illustrating an example of a sharpened portion of a hexaboride single crystal tip sharpened by using electrolytic abrasion at the end of the hexaboride single crystal tip illustrated in FIG. 16.

Then, in Example 2, a hexaboride field emission electron source using the (013) plane as the electron emission surface was prepared and evaluated. As the hexaboride single crystal 103, $CeB_6$ was used. A method of manufacturing a hexaboride single crystal tip 104 in the field emission electron source according to Example 2 is to be explained with reference to FIG. 16. First, the crystal axis of the hexaboride single crystal 103 is measured by using, for example, an X-ray Laue method and the crystal is cut out at an angle of 18.4° relative to the major axis of the hexaboride single crystal 103 along (013) crystal axis. Successively, the end of the hexaboride single crystal tip 104 is sharpened. With the recent improvement of the electrolytic abrasion solution, the apex of the hexaboride single crystal tip 104 can be sharpened without using a focused ion beam used in Example 1 and sharpening was attained only by electropolishing in Example 2. FIG. 17 shows a scanning electron microscopic photograph for the sharpened portion 106 of the hexaboride single crystal tip 104 sharpened only by electron polishing.

Figure 18:
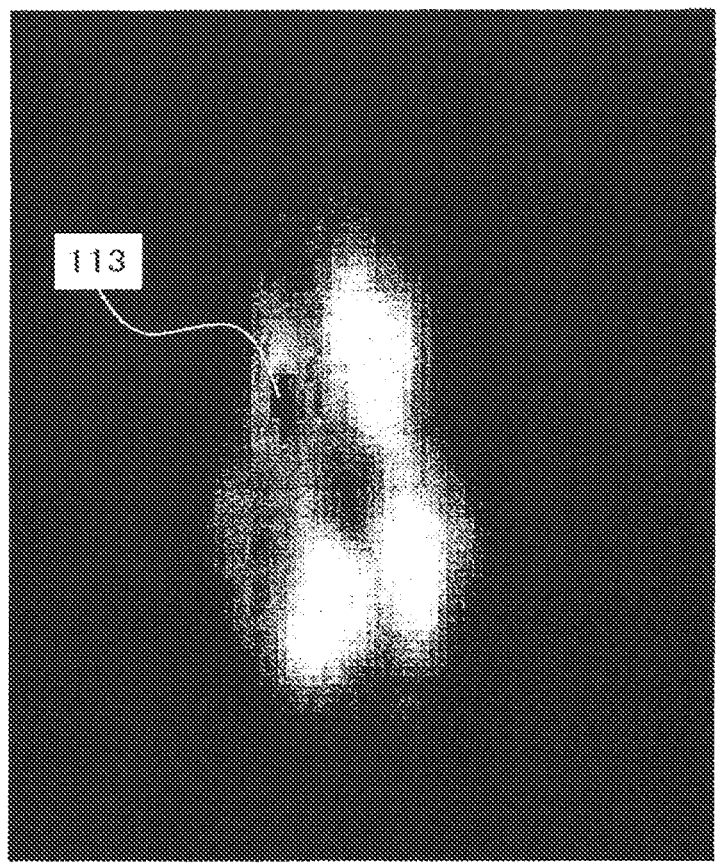
FIG. 18 is an FEM (Field Emission Microscopic) image illustrating that the sharpened portion of the hexaboride single crystal tip of the field emission electron source according to Example 2 is a (013) surface.
Figure 19:
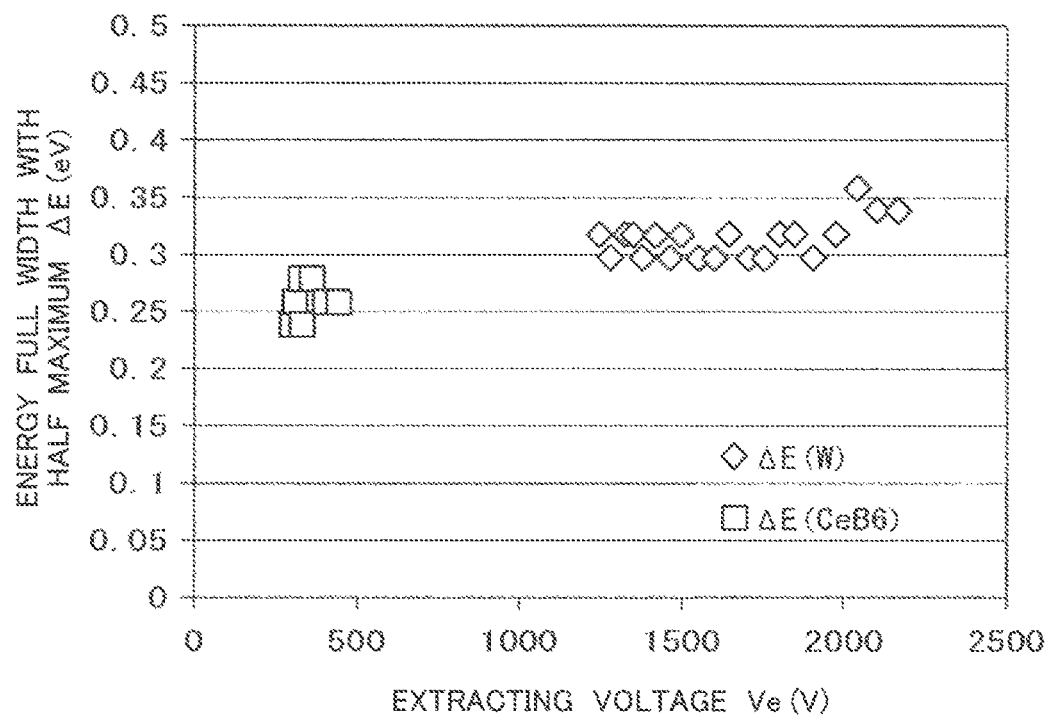
FIG. 19 is a graph comparing an energy full width with half maximum of emitted electrons in the field emission electron source according to Example 2 using the hexaboride with an energy full width with half maximum of emitted electrons in the existent field emission electron source using W.

The thus prepared hexaboride single crystal tip 104 was assembled to a field emission electron source by a method identical with that of Example 1, which was attached to a measuring device as shown in FIG. 11 and evaluated. FIG. 18 shows an example of an FEM image of an electric field emission electron source cleaned by heat flashing. A four-fold symmetry pattern is confirmed for (013) surface in view of this FEM images, and it can be seen that the (013) surface crystal terrace (facet) is formed at the apex of the sharpened portion of $CeB_6$ hexaboride field emission electron source. FIG. 19 illustrates an energy full width with half maximum of emitted electrons. A narrow energy full width with half maximum (0.2 to 0.25 eV) at about ⅔ narrow width in average could be obtained with a low extracting voltage of about ⅓ compared with the W field emission type electron source.

Figure 20:
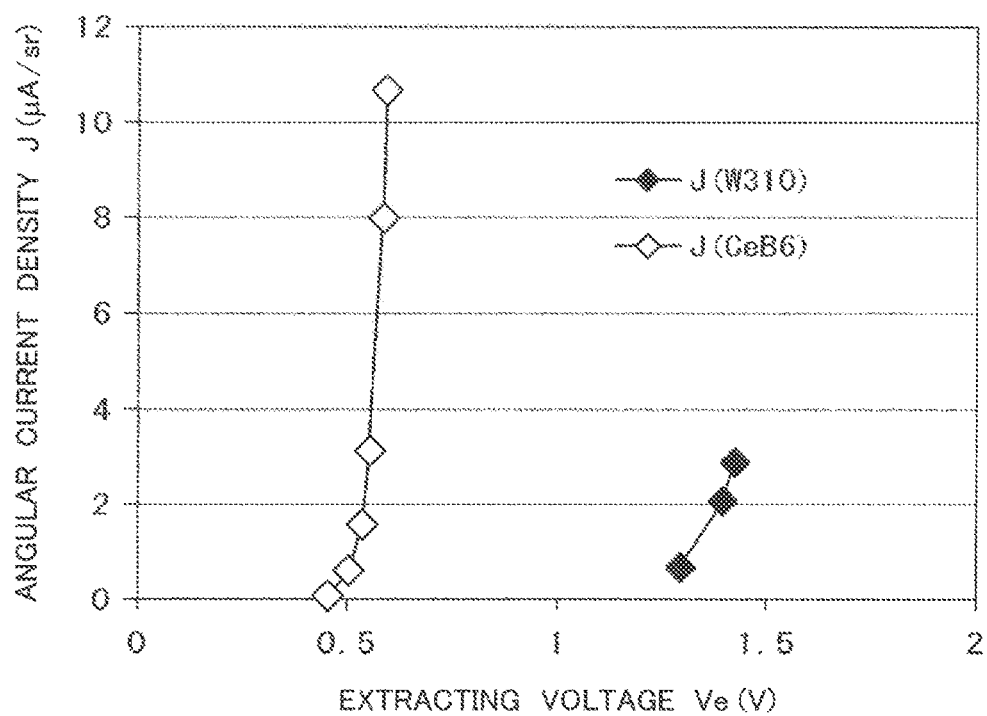
FIG. 20 is a graph comparing a angular current density in a field emission electron source according to Example 2 using a hexaboride with a angular current density in an existent field emission electron source using W.

FIG. 20 shows a result of measurement for the angular current density performed by using a Faraday cup for detecting current instead of the energy analyzer 114 shown in FIG. 11. In the field emission electron source according to Example 2, a angular current density higher than that of the W field emission electron source could be obtained at a low extracting voltage of about ⅓ compared with that for the W electric field emission type electron source.

As described above, according to Example 2, the same effect as in Example 1 can be obtained. Further, fluctuation of the elemental composition at the termination surface in the electron emission surface can be suppressed by defining the crystal plane of the sharpened portion 106 of the hexaboride single crystal tip 104 as a (01n) plane in which n is an odd number, or an equivalent plane thereof.

Example 3

Example 3 is to be explained with reference to FIG. 21. Matters described in Example 1 or 2 and not described in Example 3 can be applied also to Example 3 unless there is no particular case. Example 3 shows an example of a scanning electron microscope mounting a field emission electron source using the hexaboride single crystal prepared in Example 1 or 2. Although description is to be made to an example of the scanning electron microscope in Example 3, this is not restrictive.

Figure 21:
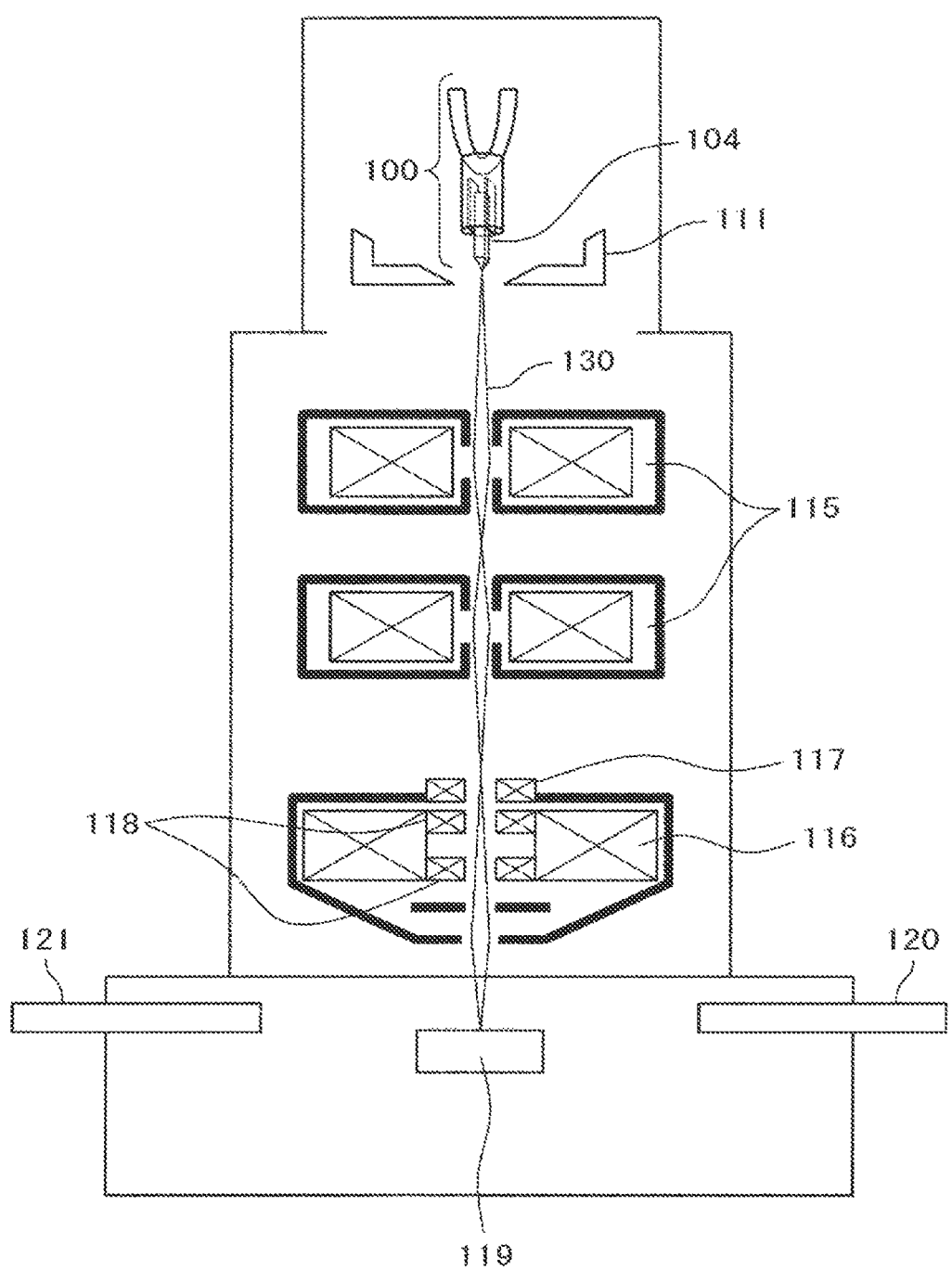
FIG. 21 is a schematic cross sectional view of an electron beam device according to Example 3 (scanning electron microscope mounting a boride field emission electron source).

FIG. 21 is a schematic view of a scanning electron microscope according to Example 3. Electrons emitted from a hexaboride single crystal tip 104 of the field emission electron source 100 are accelerated by an anode 111 to form an electron beam 130, focused through a condenser lens 115, an objective lens 116, and an astigmatic correction coil 117, scanned by a deflection scanning coil 118 and radiated to an observation region over a specimen 119, and generated secondary electrons are detected by a secondary electron detector 120. Reference numeral 121 denotes an element analyzer. Since electrons emitted from the hexaboride single crystal tip 104 have better monochromaticity compared with those of the W field emission electron source, chromatic aberration in the condenser lens 115, the objective lens 116, etc. are reduced, a more restricted electron beam 130 can be radiated on the sample 119, to obtain a scanning electron microscopic image at high resolution. Further, since the image has high brightness, imaging time is short and analysis time for elemental analysis can also be shortened. As described above, the performance of the electron microscope could be improved by mounting the field emission electron source described in Example 1 or 2.

As described above, according to Example 3, effects identical with those of Example 1 or 2 can be obtained. Further, also in a case of using hexaborides, it is possible to provide an electron beam device capable of obtaining an electron beam at high brightness capable of reducing noise or aging change even in a case of using the hexaboride, enabling stable operation and excellent in monochromaticity.

In view of the above, the field emission electron source according to Examples 1 to 3 includes a heater including a metal filament, a metal member joined to the heater, a hexaboride tip of emitting electrons from the apex upon generation of electric field, and graphite sheets independent of the metal member and the hexaboride tip, in which the hexaboride tip is disposed so as to protrude from the inside of the metal member in the direction opposite to the heater extending direction, disposed by the graphite sheets so as not to be in direct contact with the metal member by the graphite sheets, and further has a structure in which the hexaboride tip, the graphite sheet, and the metal member are in mechanical and electric contact.

Further, the field emission electron source may include a hexaboride single crystal tip having a sharpened portion, graphite sheets having a structure of sandwiching the hexaboride single crystal tip therebetween so as to expose the sharpened portion, a metal member having a structure of sandwiching the hexaboride single crystal tip by way of the graphite and in plural point-to-point contacts with the graphite sheet, and a metal heater joined with the metal member.

Further, the method of manufacturing the field emission electron source may include a step of providing a hexaboride single crystal tip having a sharpened portion, a step of arranging graphite sheets while sandwiching the hexaboride single crystal tip therebetween so as to expose the sharpened portion, a step of arranging a metal tube so as to dispose therein the graphite sheets which are disposed while sandwiching the hexaboride single crystal tip therebetween, and a step of press bonding the metal tube so as to sandwich the graphite sheet between the metal tube and the hexaboride single crystal tip.

Further, the electron beam device may include any one of the field emission electron sources described above, a specimen bed for placing a specimen thereon, and an electron optical system of irradiating the specimen on the specimen bed with the beam emitted from the field emission electron source.

The present invention is in no way restricted to the examples described above but includes various modified examples.

For example, examples described above have been explained specifically for making the present invention easy to understand and is not restricted to one having all of the configurations described above. Further, a portion of the configuration of an example may be replaced with that of another example. Further, a configuration of an example may be combined with that of another example. Further, a portion of the configuration for each of examples may be put to addition, deletion, and substitution with another configuration.

LIST OF REFERENCE SIGNS

100 field emission electron source
101 metal atom
102 boron atom
103 hexaboride single crystal
104 hexaboride single crystal tip
105 electropolishing portion
106 sharpened portion
107 filament
108 metal member (metal tube)
109 graphite sheet
110 colorimetric thermometer
111 anode
112 fluorescent plate
113 probe hole
114 energy analyzer
115 condenser lens
116 objective lens
117 deflection correction coil
118 polarization scanning coil
119 specimen
120 secondary electron detector
121 element analyzer
130 electron beam

The invention claimed is:

1. A field emission electron source comprising:
   a heater including a metal filament;
   a metal member joined to the heater;
   a hexaboride tip emitting electrons from an apex upon generation of an electric field; and
   graphite sheets arranged between the metal member and the hexaboride tip;
   wherein the hexaboride tip is arranged so as to protrude from the inside of the metal member in a direction opposite to the extending direction of the heater, and arranged so as to be in structural contact with the graphite sheets, and further, has a structure in which the hexaboride tip and the metal member are mechanically and electrically in contact with each other via the graphite sheets, and
   wherein the graphite sheets extend toward the metal filament beyond an end of the hexaboride tip opposite of the apex without contacting the metal filament.

2. The field emission electrode source according to claim 1,
   wherein the heater including the metal filament is made of tungsten, tantalum, niobium or molybdenum.

3. The field emission electrode source according to claim 1,
   wherein the metal member is a metal tube made of tantalum, niobium, tungsten or molybdenum.

4. The field emission electrode source according to claim 1,
   wherein the hexaboride tip is a single crystal tip having a sharpened portion at an end.

5. The field emission electrode source according to claim 1,
   wherein the graphite sheet is a pyrolytic graphite sheet.

6. A field emission electron source comprising:
a hexaboride single crystal tip having a sharpened portion;
graphite sheets having a structure of sandwiching the hexaboride single crystal tip therebetween so as to expose the sharpened portion and in contact with the hexaboride single crystal tip at plural point-to-point contacts;
a metal member having a structure of sandwiching the hexaboride single crystal tip by way of the graphite sheet and in plural point-to-point contacts with the graphite sheet; and
a metal heater joined to the metal member;
wherein the graphite sheets extend toward the metal heater beyond an end of the hexaboride tip opposite of the sharpened portion without contacting the metal heater.

7. The field emission electron source according to claim 6,
wherein the sharpened portion has a (01n) surface in which n is represents an odd number.

8. An electron beam device comprising:
the field emission electron source according to claim 6;
a sample bed for placing a sample; and
an electron optical system for radiating the sample over the specimen table with electrons emitted from the field emission electron source.

9. A method of manufacturing a field emission electron source comprising:
a step of providing a hexaboride single crystal tip having a sharpened portion;
a step of arranging graphite sheets while sandwiching the hexaboride single crystal tip therebetween so as to expose the sharpened portion;
a step of arranging a metal tube such that the graphite sheets which are disposed while sandwiching the hexaboride single crystal tip are disposed in the inside;
a step of press bonding the metal tube so as to sandwich the graphite sheet between the hexaboride single crystal tip; and
a step of joining a metal heater to the metal tube;
wherein the graphite sheets extend toward the metal heater beyond an end of the hexaboride single crystal tip opposite of the sharpened portion without contacting the metal heater.

10. The method of manufacturing a field emission electron source according to claim 9,
wherein the sharpened portion is formed by using a focused ion beam or electropolishing.

11. An electron beam device comprising:
the field emission electron source according to claim 1;
a sample bed for placing a sample; and
an electronic optical system for radiating the sample on the sample bed with electrons emitted from the field emission electron source.

* * * * *